Inventor
Anthony Trujillo
By Peter S. Lucyshyn
Attorney

Oct. 15, 1968 A. TRUJILLO 3,406,355

OSCILLATOR CIRCUIT

Filed Dec. 27, 1966 2 Sheets-Sheet 2

Inventor
Anthony Trujillo

By Peter S. Lucyshyn
Attorney

United States Patent Office 3,406,355
Patented Oct. 15, 1968

3,406,355
OSCILLATOR CIRCUIT

Anthony Trujillo, Carpentersville, Ill., assignor to Borg-Warner Corporation, Chicago, Ill., a corporation of Illinois Filed Dec. 27, 1966, Ser. No. 604,748
5 Claims. (Cl. 331—111)

ABSTRACT OF THE DISCLOSURE

An oscillator circuit includes a first pair of junctions 34, 35 for energization from a D-C voltage. Two branch circuits 38, 39 and 40, 41 are coupled between the first pair of junctions 34, 35. A second junction pair 36, 37 is defined at intermediate points in the two branch circuits. A load $R_L$ (and/or $r_L$) is coupled in series with at least one branch circuit, and a semiconductor switching circuit 33 is connected to regulate current flow through the load as a function of a difference signal 68 determined by the potentials at the second junction pair 36, 37 in the two branch circuits.

The present invention relates to an oscillator and more particularly to a relaxation type oscillator for providing pulses at a stable rate, i.e., a stable frequency, even with variations in supply voltage.

Oscillators in the prior art of the relaxation type, utilizing the transient represented by the charge or discharge of a capacitor or inductor through a resistor, are especially sensitive to supply voltage variations. The frequency of the output signal cannot be maintained within required practical limits unless a regulated power supply is used. Also, semiconductor relaxation oscillators are extremely temperature sensitive and extensive design considerations must be given to obtain stable oscillator operation with ambient temperature changes. Excessive drift by an oscillator prevents its use in applications where reasonable frequency stability is necessary.

Accordingly, it is an object of the present invention to provide an improved oscillator which has a substantially constant frequency within predetermined limits even with variations in a power supply voltage and with temperature variations.

It is an additional object of the present invention along the lines of the above to provide an improved oscillator having a high power output during a pulse.

It is an overall object along the lines of the above to provide an economically manufacturable and easily maintainable oscillator circuit.

Advantages of the present invention will become apparent from a reading of the following detailed description and upon reference to the drawings in which FIGURE 1 is a circuit diagram of a prior art transistor multi-vibrator circuit;

Figure 1:
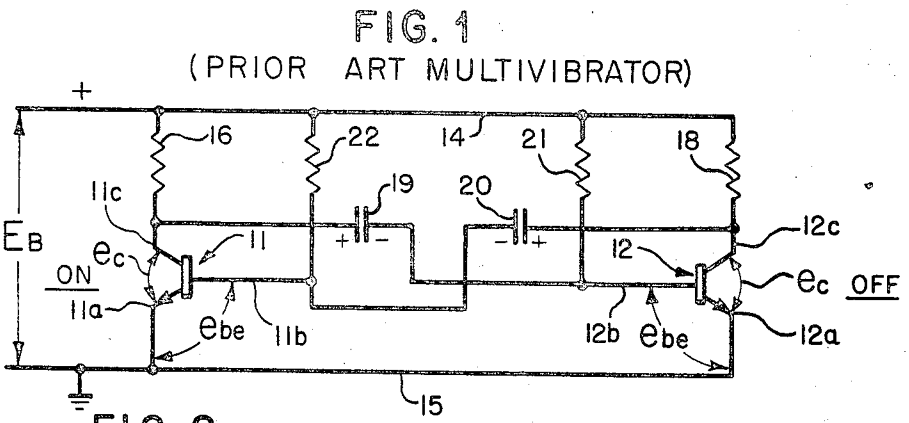

Turning to the drawings, shown in FIGURE 1 is an exemplary prior art multi-vibrator circuit 10 including respective NPN transistors 11, 12 connected to conductors 14 and 15 comprising respectively the positive and negative terminals of a supply voltage $E_B$. A collector **11*c* of transistor 11 and collector 12*c* of transistor 12 are connected through individual resistance 16, 18, respectively, to the positive terminal 14 of the supply voltage $E_B$. Cross-coupling is effected between the transistors via capacitors 19, 20, respectively, the collector 11*c* of transistor 11 being coupled through capacitor 19 to base 12*b* of the transistor 12, and the collector 12*c* of transistor 12 being coupled through the capacitor 20 to base 11*b* of the transistor 11. In order to provide base drive for the transistors, in the illustrative embodiment this is accomplished by biasing the base positive with respect to the emitter, the respective bases 11*b*, 12*b* are connected to the supply positive terminal 14 through respective resistors 22, 21**.

Describing the operation of the prior art multi-vibrator, it is assumed that transistor 11 is biased to conduction and capacitor 19 is discharging therethrough. The discharge circuit includes resistor 21, capacitor 19 and the collector-emitter of transistor 11. At the same time, capacitor 20 has been charging through a circuit including resistor 18, capacitor 20, and the base-emitter of transistor 11. When capacitor 19 has discharged sufficiently so that the voltage at **12*b* has risen above the contact potential of the base-emitter diode in transistor 12, the latter is biased "on." The result is that the "positive" end of capacitor 20 is brought substantially to ground potential thereby dropping the potential of base 11*b* connected to the "negative" or other end of the capacitor. Since the emitter 11*a* of transistor 11 is connected to ground, the base is driven strongly negative relative to the emitter causing the transistor 11** to be quickly switched "off." Shown in FIGURES 2 and 3 are respective plots of the base-to-emitter voltage "$e_{be}$" and the collector voltage "$e_c$."

The plot 25 shows the rise in biasing voltage for the non-conducting one of the pair of transistors 11, 12, as one of the capacitors 19, 20, associated with the base of that particular transistor charges toward the potential of the collector supply voltage. As shown by the broken line extension of plot 25 the discharging capacitor has an urge to charge in the opposite direction, $+E_B$, however, because the opposite transistor is switched "on" by the forward potential between base-and-emitter, the charge-up in the opposite direction is prevented. The plot 26 shows the clamped, positive base voltage $V_{BE}$ for the aforementioned transistor after it has become conductive. Represented in FIGURE 3 by plot 28 is the collector voltage for the non-conducting transistor, and represented by plot 29 is the collector voltage for the conducting transistor. As is clear from the foregoing description as one transistor turns "on" the other transistor is biased "off." The cycle repeats after the capacitor 20 has discharged sufficiently so that the voltage at the base **11*b* of transistor 11** rises above the contact potential of the base-emitter diode.

Figures 2, 3, 4, 5, 6:
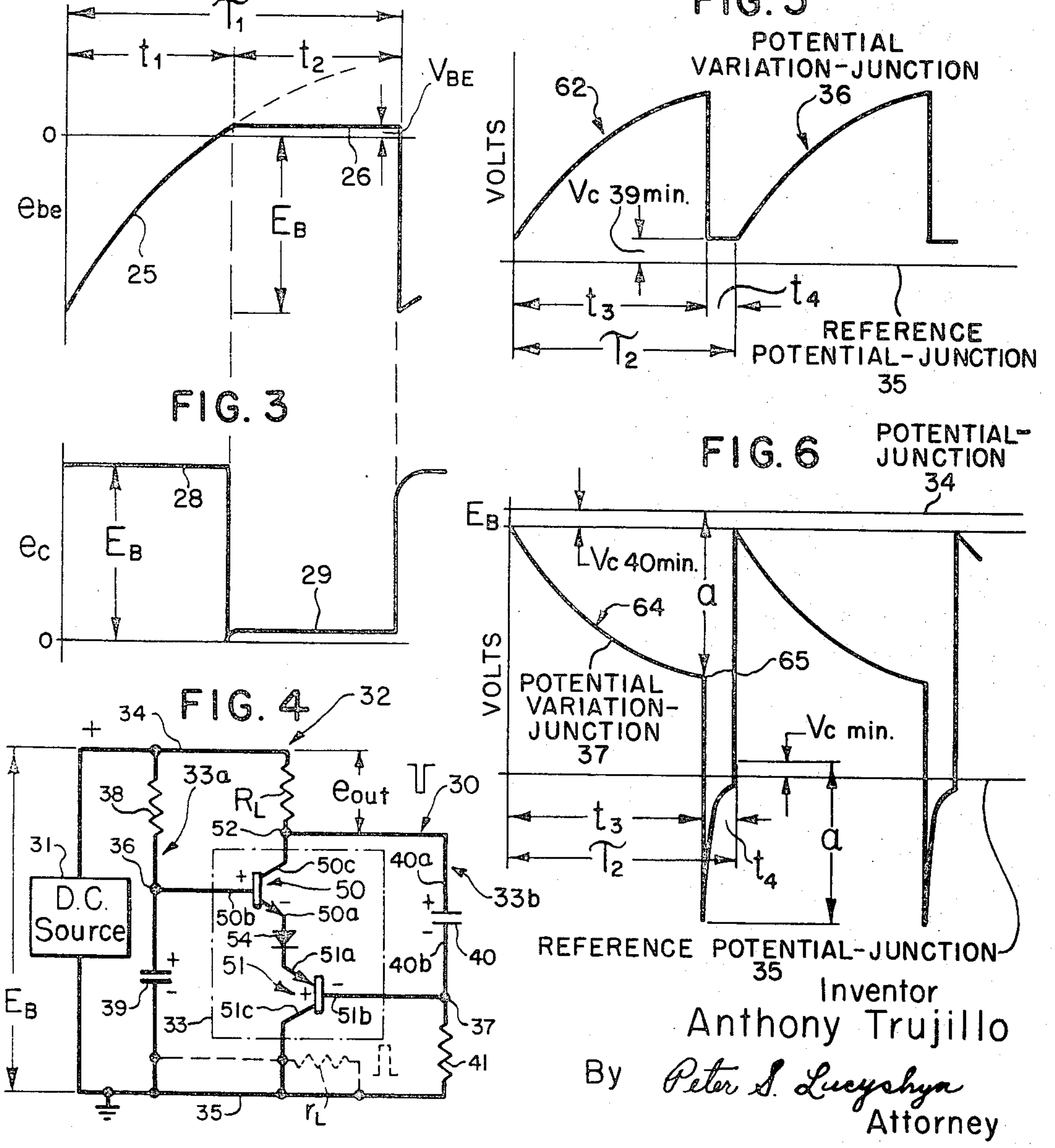
FIGURE 2 is a plot of a biasing signal for one of the transistors in the circuit of FIGURE 1.
FIGURE 3 is a plot of an output signal voltage across one of the transistors in the circuit of FIGURE 1.
FIGURE 4 is a circuit diagram of an oscillator embodying the teachings of the present invention.
FIGURE 5 is a diagrammatic representation of voltage variations between a pair of selected points in the circuit of FIGURE 4 related to the period of the oscillator.
FIGURE 6 is a plot of additional voltage variations appearing between a pair of selected points in the circuit of FIGURE 4 related to the period of the oscillator emphasizing the voltage variation during operation of a switching means.

As shown in FIGURES 2 and 3, a reference character $\tau_1$, represents the period of the multi-vibrator 10, $\tau_1$ is the sum of $t_1$, exemplarily representing the "on" time of transistor 11, and $t_2$, exemplarily representing the "on" time of transistor 12. The mathematical expression for the voltage during either of the respective time periods $t_1$ or $t_2$ is:

$$V_c = -2E_B \exp\left(\frac{-t}{RC}\right) + K$$

where $V_c$ is the voltage across either capacitor 19 or 20, whichever one of those is charging as shown in FIGURE 2 and described above, $E_B$ is the D-C source potential, R is the discharge resistor in the particular circuit, i.e. resistor 21 or resistor 22, and K is an integration constant. The expression includes $2E_B$ because the conducting transistor brings the negative end of the capacitor charged to $E_B$ volts to ground thereby combining with the D-C source voltage $E_B$ to apply $2E_B$ across the discharge resistor. The equation is solved for K by requiring it to meet the following conditions: (1) When $t=0$, $V_c=-E_B$; and (2) when $t=\infty$, $V_c=+E_B$. Solving the equation for $t$, the following expression is obtained:

$$t = -RC \ln\left(\frac{E_B - V_{BE}}{2E_B}\right)$$

It is clear from the latter expression that the "on-time" or $t$ for either one of the transistors depends not only upon the selected values of the resistor and capacitor *but also upon the supply voltage* $E_B$. The actual value of either $t_1$ or $t_2$ can be obtained by substituting into the expression the values of the appropriate impedances in the individual charging circuits which control the base current for the respective transistors 11 and 12. Summarizing, the frequency with which pulses are produced by the prior art multi-vibrator circuit are clearly dependent on the supply voltage as well as the impedances in the transistor biasing circuits.

In accordance with the present invention an improved oscillator circuit 30 is provided which effects a high power pulse output at a stable frequency even with supply voltage variations as compared to heretofore known multivibrator circuits. Shown in FIGURE 4 is a preferred embodiment of the present inventive oscillator 30 which is energized by a D-C source 31 and includes a bridge circuit 32 and a switching circuit 33. The bridge circuit has a first set of junctions 34, 35, herein repersented by common conductors, and a second set of junctions 36, 37. The D-C source is connected across the junctions 34, 35 applying a voltage $E_B$ thereto. Circuit elements are provided between the respective bridge circuit junctions 34, 35, 36, and 37 responsive to energization by the source. Upon initial energization a signal having a first polarity is effected across the second set of junctions 36, 37. The circuit elements are time-responsive to establish a signal having an opposite polarity across the latter junctions after a predetermined period of time (see FIGURE 7) and thereby operate the switching means 33 to produce a pulse output and effect a return of the circuit elements to their initial state in which the polarity across the second pair of junctions 36, 37 is the same as at the aforesaid initiation of circuit operation. The switching circuit 33 is coupled to the bridge circuit 32 so as to sense the voltage between bridge circuit junctions 36, 37 and respond thereto by effecting a pulse signal output across a load, herein shown as a resistor $R_L$.

Describing the bridge circuit 32 in more detail, a first impedance branch 33$a$ between junctions 34 and 35 includes a resistor 38 and a capacitor 39, while a second impedance branch 33$b$ between the same junction points includes the load resistor $R_L$ in series with a capacitor 40 and a resistor 41. The illustrative embodiment of switching circuit 33 includes a pair of series connected transistors 50, 51. It is, of course, understood to be within the teachings of the present invention to adapt vacuum tubes as well as microcircuits, integrated circuits and other semi-conductor devices to effect the switching function. In the present instance transistor 50 is preferably an NPN transistor which has an emitter 50$a$, a base 50$b$, a collector 50$c$, while transistor 51 is preferably a PNP transistor which has an emitter 51$a$, a base 51$b$, a collector 51$c$. A second load resistor $r_L$ is shown in phantom. Describing the alternative embodiment of the circuit, one end of resistor $r_L$ is connected to the junction 35 and an opposite end is connected to transistor collector 51$c$ and one end of capacitor 39. By providing resistor $r_L$ in the circuit positive going pulses can be received from the oscillator either in conjunction with, or instead of the negative going pulses that are received from resistor $R_L$.

For sensing the signal between junctions 36, 37 connected thereto are the transistors bases 50$b$, 51$b$, respectively. To effect both a pulse output across the load resistor $R_L$, and also to effect a cyclical discharge of bridge circuit capacitors 39, 40, collector 50$c$ of transistor 50 is connected to a junction 52 between load resistor $R_L$ and capacitor 40, while collector 51$c$ of transistor 51 is connected to the junction 35, the latter also being connected to one side of the supply voltage $E_B$. In addition the emitter 50$a$ of transistor 50 and the emitter 51$a$ of transistor 51 are coupled in series. Presently, a diode 54 is provided in the latter series circuit to protect the transistors, especially if they are of the silicon type, against excessive reverse emitter-to-base voltage.

Figure 10:
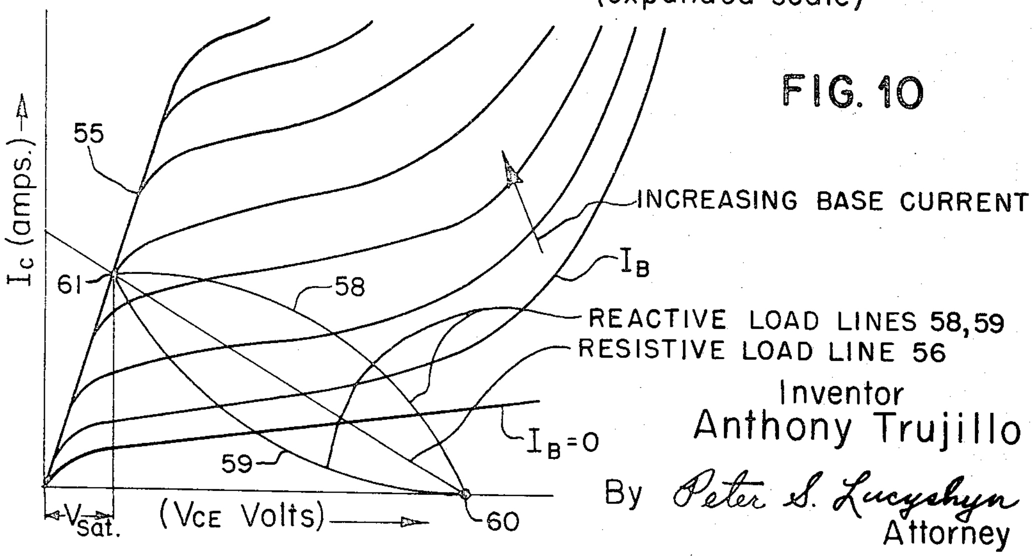
FIGURE 10 is a characteristic curve of an exemplary transistor used in the circuit of FIGURE 4.

Shown in FIGURE 10 is a representative set of characteristic curves for a transistor of the type usable in the switching means 33. The abcissa represents collector voltage in volts while the ordinate represents collector current in amperes. The respective curves are obtained in a manner well known to those skilled in the art by selecting values of base current and maintaining the latter constant while the collector voltage is varied. The different values of base current have a common origin which is a line 55 representing the saturation curve for the transistor. Also shown in FIGURE 10 are a set of load lines, a resistive load line 56 and a pair of reactive load lines 58, 59. These load lines are determined by the circuit in which the transistor has to operate. A point 60 is where the load line 56 intersects the abcissa and is the voltage applied to the transistor while the latter is not conducting and is fixed by the supply voltage. Another point 61 is where the load line 56 intersects the saturation curve 55 and determines the saturation voltage $v_{sat}$ across the transistor when the letter is conducting at full capacity.

Turning to FIGURES 5–9 and the operation of the present oscillator, a reference character $\tau_2$ represents the period of the present oscillator. $\tau_2$ is comprised of a period $t_3$ and a period $t_4$. In practice period $t_3$ is very much greater than time period $t_4$. The respective plots do not properly show the relative time periods $t_3$ and $t_4$ to scale. This is because there are voltage changes in the bridge circuit during time period $t_4$ which are important, and these can be shown only by expanding time scale $t_4$. In one practical application the ratio $t_3/t_4$ was equal to 1000/1.

Turning to these figures individually, FIGURE 5 is a curve in which the abcissa represents time and the ordinate represents voltage. Selected as a reference is the potential of junction 35 in the circuit of FIGURE 4. A plot 62 represents the variation of the potential of bridge junction 36 as measured with respect to the potential of bridge junction 35. In other words the plot 62 represents the voltage variation across capacitor 39. As is clear from FIGURE 5, the capacitor charges so that the potential of junction 36 increases with respect to the potential at junction 35 until the time period $t_3$ has elapsed. After this time period has elapsed as explained in more detail subsequently, the switching circuit 33 operates to discharge the capacitor during the period $t_4$ to a minimum voltage $v_{C39_{min}}$.

Turning to FIGURE 6, there shown is a variation in potential of junction 37. Again, the abcissa represents time and the ordinate represents voltage with the reference point also being the junction 35. A plot 64 represents the variation in voltage at junction 37 with respect to junction 35. At the beginning of time period $t_3$ the potential of junction 37 is approximately that of bridge junction 34 which is connected to the positive side of supply voltage 31. There is a voltage drop across capacitor 40, $v_{C40}$ and a negligible voltage drop across load resistor $R_L$. As the voltage across capacitor 40 increases during charging of the latter, more of the supply voltage $E_B$ appears across capacitor 40, and the potential of junction 37 therefore drops relative to the potential of junction 35. This is represented in FIGURE 6 as occurring during the time period $t_3$. The exponential curve 64 may be represented by the mathematical expression:

$$\frac{R_{41}}{R_{41}+R_L}E_B \exp\left[-\frac{t}{(R_{41}+R_L)C_{40}}\right]$$

At the end of time period $t_3$, represented by a point 65 of plot 64, the turn "on" of switch 33 sharply drops the potential of junction 37 below the potential of junction 35 by a voltage $a$ as represented in FIGURE 6. Explaining, the capacitor 40 has a pair of opposite ends 40*a*, 40*b*, respectively, and in the exemplary instant of time, the capacitor end 40*a* is charged to a positive potential. The other capacitor end 40*b* is negative with respect to capacitor end 40*a*, however, capacitor end 40*b* is positive with respect to the reference potential established at junction 35. When switch 33 turns "on," the capacitor positive end 40*a* is connected to the negative side of source 31, i.e. to junction 35, through the conducting transistors 50, 51. Because the capacitor positive end 40*a* is clamped above the potential of reference junction 35 by the saturation voltage drop across transistors 50, 51, presently shown as $V_{C_{min}}$, the immediate reduction or drop of potential of the portion of the circuit connected to the other or negative end 40*b* of the capacitor is $a-V_{C_{min}}$. Since junction 37 is connected to the capacitor negative end 40*b*, the latter sharp potential drop is transferred to the junction 37.

Figure 7:
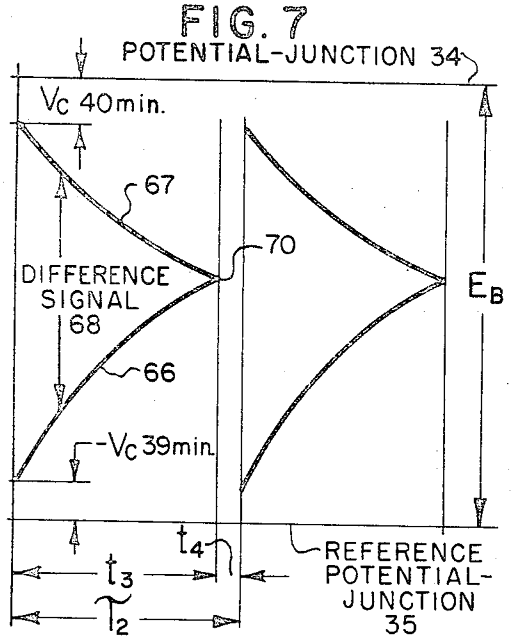
FIGURE 7 is a plot of voltage variation between four selected points in the circuit of FIGURE 4 showing a signal as received by the switching means.

FIGURE 7 is a plot in which the abcissa represents time and the ordinate represents voltage and a set of plots 66, 67 represent the change in potential at junction 36 and 37, respectively, as sensed by the switching circuit 33. These junctions are disposed, one each, in the pair of bridge branches or legs comprised of the time responsive circuit elements, one branch having resistor 38 and capacitor 39 and the other branch having load resistor $R_L$, capacitor 40 and resistor 41. The plot in FIGURE 7 combines what is shown in FIGURES 5 and 6 to show the variation in voltage resulting from charge-up of respective capacitors 39, 40. Initially a "difference" signal 68, i.e. the voltage difference between bridge junctions 36, 37, is approximately the supply voltage $E_B$, the only subtractive voltages being $v_{C40_{min}}$ and $v_{C39_{min}}$. During the time period $t_3$, as a result of the charge-up of capacitors 39, 40, the amplitude of difference signal 68, between junctions 36, 37 decreases until just prior to the end of period $t_3$, point 70 in FIGURE 7, the voltage becomes zero. Subsequently, the potential of junction 36 rises so that it is slightly more above the potential of junction 35 than is the potential of junction 37 above the potential of junction 35. That is, the polarity of signal 68 in effect, reverses. The slight change in polarity of the signal 68 between junctions 36, 37, because of the continued charging of capacitors 39, 40 turns on the switching circuit 33, thereby effecting a pulse $e_{out}$ across load resistance $R_L$, and also discharging the respective capacitors 39, 40. This occurs, as mentioned above, during a very short time period $t_4$. The pulse $e_{out}$ is shown in FIGURE 8 and because of the selected illustrative embodiment is a negative going pulse.

Describing the initiation of the pulse output at the beginning of time period $t_4$, when the polarity of the signal 68 between junctions 36, 37 reverses, the base 50*b* of transistor 50 is positive relative to the emitter 50*a* of the same transistor and the emitter 51*a* of transistor 51 is positive relative to the base 51*b* or transistor 51. The latter polarities in the respective emitter-base circuits of transistors 50, 51 causes them to be conductive. These polarities are illustrated in FIGURE 4. The transistors are quickly driven to saturation because as the respective transistors begin to conduct the voltage across each of them is reduced. That is, the resistance of the collector circuits of the respective transistors is reduced, so that the biasing voltage, as measured between base and emitter of the transistors increases, thereby causing more base current to flow. To view it another way, as the voltage across the transistors is reduced with increased base current, this being clear from the transistor characteristic curves of FIGURE 10, the emitter-to-base voltage is increased due to the voltage drop across load resistor $R_L$ and the series connection of the NPN and PNP transistors 50, 51. The increase in emitter-to-base voltage has a cumulative effect of increasing the base current so as to drive the transistors to saturation as represented by point 61 on the load line shown in FIGURE 10. Actually, the base current is somewhere along the saturation line 55 because the emitter-to-base voltage is sufficient to raise the base current above that represented at the intersection point 61 of the load line 56 and saturation curve 55.

The foregoing turn "on" of transistors 50, 51 occurs very quickly. This is because of the cumulative effect of voltage drops across the bridge circuit elements contributing to drive the transistors to saturation. Explaining, as soon as the transistors 50, 51 begin to conduct the voltage drop across load resistor $R_L$ increases, thereby driving point 52 more negative. The result of point 52 being driven negative is for the positive end 40*a* of capacitor 40 to be maintained at a lower reference potential. Thus, the negative end 40*b* of capacitor 40 drives the junction 37 more negative. Since the latter is connected to the base 51*b* of transistor 51, the emitter-base circuits of both transistors 50, 51 have an increased bias voltage applied to them. Thus, the base current is increased and transistors 50, 51 are driven further into conduction. As a result the voltage drop across load resistance $R_L$ increases further and again the above explained cumulative effect operates to bias the transistors further into conduction by increasing the base current. It is of course possible for the respective base currents of the transistors to be above the load line intersection with the saturation curve for the transistors.

Figure 8:
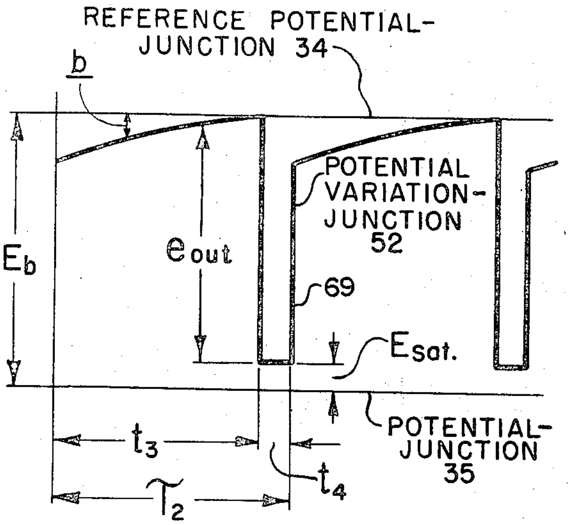
FIGURE 8 is a plot of an exemplary negative pulse output produced by the circuit of FIGURE 4.

Turning to FIGURE 8 the voltage $e_{out}$ across the load resistance $R_L$ results when the potential at junction 52 changes from a positive value near the positive potential of the supply voltage $E_B$ above the reference potential, down to a positive potential slightly above the potential of reference junction 35, the subtractive voltage being $E_{sat}$ which is the saturation voltage drop across transistors 50, 51. This is represented by a plot 69 in FIGURE 8. The voltage drop across resistance $R_L$ is very small while the transistors 50, 51 are "off." The subtractive voltage is represented by a reference character $b$. The plot of the potential variation of junction 52 with respect to time is given by the following mathematical expression:

$$\frac{R_L}{R_{41}+R_L}E_B \exp\left[-\frac{t}{(R_{41}+R_L)C_{40}}\right]$$

Summarizing, in response to conduction by the transistors the potential drop or voltage across the load resistor is sharply increased providing the output pulse.

Figure 9:
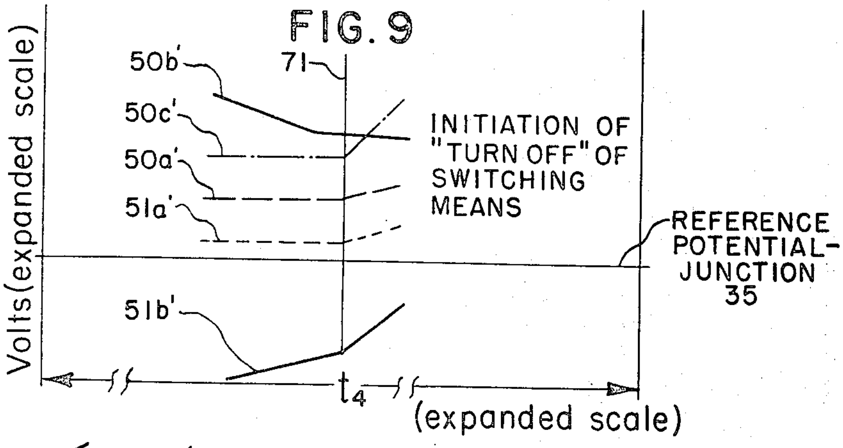
FIGURE 9 is a plot of voltage changes effecting operation of the switching means in response to the signal shown in FIGURE 7 related to a greatly expanded time scale.

The initiation of transistor turn "off" is shown in FIGURE 9. In this figure the output pulse time period $t_4$ is represented on a greatly expanded time scale. The transistors 50, 51 will turn "off" when either of the capacitors 39 or 40 discharges to its individual minimum voltage thereby causing base current for the particular one of the transistors to begin to decrease. Describing the discharge circuit for the respective capacitors, capacitor 39 discharges through a circuit including transistor base 50*b*, transistor emitter 50*a*, diode 54, transistor emitter 51*a* and transistor collector 51*c*. The other capacitor 40 discharges through a circuit including transistor collector 50*c*, transistor emitter 50*a*, diode 54, transistor emitter 51*a* and transistor base 51*b*. For the capacitor that does discharge to a minimum value ($V_{54}$ is the voltage drop across diode 54) the following equations represent the minimum capacitor voltage:

$$\text{Capacitor 39—}V_C\text{ min}=V_{be_{50}}+V_{54}+V_{ce_{Sat_{51}}}$$

$$\text{Capacitor 40—}V_C\text{ min}=V_{be_{51}}+V_{54}+V_{ce_{Sat_{50}}}$$

Once the particular capacitor discharges to a minimum voltage, for example, capacitor 40, the base current for transistor 51 is reduced so that transistor 51 does not operate at a high base current. As a result, the base current decreases along saturation line 55 and approaches point 61 on the characteristic curve of FIGURE 10.

Shown in FIGURE 9 are the relative potentials of the transistor elements, i.e. the emitter, the base and the collector. These potentials are identified by adding a prime (′) to the previous identification of the transistor elements. Explaining the turn "off" of the transistors, the discharge of capacitors 39, 40 has an opposite effect on the respective bases 50*b*, 51*b* connected thereto. As capacitor 39 discharges the voltage 50*b*′ at base 50*b* decreases, and on the other hand, as capacitor 40 discharges, the voltage 51*b*′ at base 51*b* increases. The result is that the biasing voltage for both transistors 50, 51 is decreased. Once the base current decreases below a value necessary for operating at point 61 on the characteristic curve of FIGURE 10, the collector voltage across the particular transistor begins to increase. Thus, as the collector voltage across transistor 51 increases, the voltage 51*a*′ of emitter 51*a* also begins to increase relative to the reference potential of junction 35 (FIGURE 10), thereby raising the voltage 50*a*′ of emitter 50*a* of the other transistor 50. Since the base 50*b* of that transistor is held substantially constant by the other capacitor 39 the biasing voltage for transistor 50 is decreased. This is shown in FIGURE 9 as occurring at a point represented by line 71, thus it is clear that, as voltage 50*b*′ remains substantially constant, voltage 51*b*′ rises sharply. Thus the transistor 50 comes out of saturation and the collector voltage increases sharply. The line 71 in FIGURE 9 corresponds to point 61 in FIGURE 10 since 50*c*′ begins to move along the load line as the collector voltage increases.

As the voltage across the transistor increases, the potential of junction 52 is increased and thus the capacitor 40 transfers the rise in potential to junction 37. The latter is, of course, connected to the base 51*b* of transistor 51. As shown in FIGURE 9, the potentials 50*a*′, 51*a*′, of the respective emitters 50*a*, 51*a*, are between the potentials 50*b*′ 51*b*′ of the respective bases 50*b*, 51*b*. The result is that both transistors are sharply driven into non-conduction once either of the capacitors 39 or 40 discharges to its minimum value.

It is noted that both capacitors need not discharge to the aforedefined minimum value. This is because once one of the capacitors discharges to the minimum value, the turn "off" of the transistors is initiated and the other capacitor does not have an opportunity to discharge further.

It is clear from the foregoing that the switching circuit 33 includes a pair of sensing terminals, presently 50*b*, 51*b*, respectively, and a pair of switching terminals, presently 50*c*, 51*c*, respectively. When the polarity of the signal between terminals 50*b*, 51*b*, respectively, is proper the switching terminals 50*c*, 51*c* cooperate to effect a pulse output across the load resistor, i.e. either $R_L$ or $r_L$ or both.

As already noted, one practical example $t_3$ was selected to be about $10^3$ times as long as $t_4$. Thus, the time in which capacitors 39, 40 discharge and turn "off" the transistors after the bridge circuit has effected turn "on" of the transistors is very short. Because the voltage drop across the transistors is low, substantially all of the supply voltage can be applied to the load resistor $R_L$. This provides a high energy pulse output from the circuit 30 which is particularly desirable of, for example, oscillators used in logic circuits for inverters. The time period $t_3$ which is substantially the period of the multivibrator 30 is independent of the supply voltage $E_B$. The following mathematical expression gives the time period for the multivibrator 30:

$$-\exp\,[t_3/(R_{41}+R_L)C_{40}]=1-\exp\,[t_3/R_{38}C_{39}]$$

The above expression is derived by mathematically setting forth the conditions at point 70 in FIGURE 7. This is at the end of time period $t_3$ when the voltage across capacitor 39 and the voltage across resistance 41, using junction 35 as a reference, are equal. In other words, difference signal 68 is zero. Each of these voltages are represented by respective exponential functions characteristic of a charging capacitor. Since the above expression when solved for "$t_3$" does not include a value for supply voltage the present improved oscillator circuit has a frequency substantially independent of variations in supply voltage within practically acceptable limits.

It is also to be noted that selection of circuit elements is not particularly critical. Equal voltage point 70 in FIGURE 7 need not be at the exact midpoint of the supply voltage $E_B$. It may be anywhere in between as required by design.

It is another feature of the present invention that the frequency of the oscillator circuit 32 is substantially independent of ambient temperature. Customarily temperature instability of semiconductor relaxation oscillators is due to three factors, leakage current (collector-to-base current) change, current gain ($\beta$) change, and base-emitter voltage change of the semiconductors as the temperature varies.

In the present system the transistors 50, 51, are reverse biased during nearly the complete period $\tau_2$ of the oscillator, i.e. during time period $t_3$. The leakage current is thus $I_{CBO}$ which is basically the collector-to-base diode reverse biased. The current gain change of the transistors 50, 51 with temperature has an effect only during the time period that the transistor is "on," which is $t_4$, and the latter is a very small portion of the total time period $\tau_2$. Finally, the temperature variation effected base-emitter voltage changes of the transistors 50, 51, can be easily designed for by using a relatively large voltage power supply as compared to the temperature effected voltage change, making the latter voltage change an insignificant portion of the supply voltage.

It is clear from the foregoing that the present invention oscillator circuit provides a high energy pulse signal during a relatively short period of time at a repetition rate which is substantially independent of variation in supply voltage. The frequency depends upon the charging rates of the respective capacitors. The circuit is simple and therefore easy to design and permits use of semiconductor devices having parameters that are easily maintained in ordinary commercial production. Because of the stability of the oscillator circuit it provides reliable operation where high energy pulses are necessary.

While the invention has been described in connection with a preferred embodiment, it will be understood that I do not intend to be limited to the illustrative embodiment, but intend to cover the alternative and equivalent constructions which are included within the spirit and scope of the appended claims.

I claim as my invention:

1. An oscillator circuit connected between first and second input conductors for energization by a D-C potential difference applied between said first and second input conductors, comprising a first branch circuit including a first resistor coupled to said first input conductor, and a first capacitor coupled between said first resistor and said second input conductor, a second branch circuit comprising a second capacitor coupled to said first input conductor and a second resistor coupled between said second capacitor and said second input conductor, a load coupled in series with the resistor and capacitor in one of said branch circuits, a semiconductor switching circuit, including a first input sensing connection coupled to the junction between said first resistor and said first capacitor, and a second input sensing connection coupled to the junction between said second capacitor and said second resistor, to apply a difference signal with two opposite-polarity varying portions between said input sensing connections as said first and second capacitors are charged toward the potential difference applied between said first and second input conductors, and circuit means, including said semiconductor switching circuit, connected to complete discharge paths for both said first and second capacitors, and also to complete a series circuit with said load, when the amplitude of said difference signal decreases to zero and begins to increase in an opposite polarity direction.

2. An oscillator circuit as claimed in claim 1 and in which said semiconductor switching circuit comprises a pair of transistors each having an emitter, a base and a collector, with the base connections connected as said input sensing connections, the emitters being coupled to each other, and the collectors being connected in the circuit to complete said discharge paths.

3. An oscillator circuit as claimed in claim 2 and further comprising a diode, connected in said semiconductor switching circuit between said emitters.

4. In an oscillator circuit for energization from a D-C source, the combination comprising a bridge circuit having a first pair of junctions coupled across the D-C source, a first branch circuit coupled between said first pair of junctions including a first resistor coupled between one junction of said first pair of junctions and a third junction, and a first capacitor coupled between said third junction and the other junction of said first pair of junctions, a second branch circuit coupled between said first pair of junctions including a second capacitor coupled between said one junction of said first pair of junctions and a fourth junction, and a second resistor coupled between said fourth junction and said other junction of said first pair of junctions, a load coupled in series with the resistor and capacitor in one of said branch circuits, a switching circuit having a pair of switching terminals and a pair of sensing terminals, said sensing terminals coupled to said third and fourth junctions and said switching terminals connected to complete discharge paths for both said first and second capacitors and also to complete a series circuit with said load, which switching circuit operates in response to application of a difference signal between said third and fourth junctions decreasing to zero in a given polarity direction and incrementally increasing in an opposite polarity direction to complete a circuit between said switching terminals and provide a pulse output voltage across said load and also to discharge both said capacitors, thus returning said bridge circuit to an initial state wherein the polarity of said difference signal across said third and fourth junctions is the same as when said difference signal was decreasing to zero.

5. The combination of claim 4 wherein said switching circuit includes a first transistor having a collector, a base and an emitter and a second transistor having a collector, a base and an emitter, said first transistor emitter being coupled to said second transistor emitter, said first transistor base being connected to said third junction and said second transistor base being connected to said fourth junction, said first and second transistor collectors, respectively, being coupled to said switching terminals, said transistors being biased to conduction in response to application of a predetermined difference signal across said bases to sharply change the voltage across said load and provide a pulse output voltage.

References Cited

UNITED STATES PATENTS

| | | | |
|---|---|---|---|
| 3,039,066 | 6/1962 | Kenny | 331—113 |
| 3,131,362 | 4/1964 | Dersch | 331—145 |

FOREIGN PATENTS

| | | |
|---|---|---|
| 726,266 | 1/1966 | Canada. |

OTHER REFERENCES

MacDougall, Raytheon, Semiconductor Engineering File, No. 154–T, December 1960 (3 pgs.).

JOHN KOMINSKI, *Primary Examiner.*